(12) United States Patent
Cranford, Jr. et al.

(10) Patent No.: US 6,275,094 B1
(45) Date of Patent: Aug. 14, 2001

(54) CMOS DEVICE AND CIRCUIT AND METHOD OF OPERATION DYNAMICALLY CONTROLLING THRESHOLD VOLTAGE

(75) Inventors: Hayden Clavie Cranford, Jr., Apex; Geoffrey B. Stephens, Cary, both of NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/338,214

(22) Filed: Jun. 22, 1999

(51) Int. Cl.[7] ....................................................... H03K 3/01
(52) U.S. Cl. ............................................. 327/534; 327/307
(58) Field of Search .................................... 327/534, 536, 327/307

(56) References Cited

U.S. PATENT DOCUMENTS

| | | |
|---|---|---|
| 5,103,277 | 4/1992 | Caviglia et al. . |
| 5,341,034 * | 8/1994 | Matthews .............................. 327/534 |
| 5,557,234 | 9/1996 | Collins .................................. 327/563 |
| 5,594,381 * | 1/1997 | Bingham .............................. 327/534 |
| 5,646,900 | 7/1997 | Tsukude et al. . |
| 5,748,029 * | 5/1998 | Tomasini et al. ..................... 327/534 |
| 5,748,061 * | 5/1998 | Kurosawa ............................. 327/534 |
| 5,808,346 | 9/1998 | Ueda . |
| 5,814,899 | 9/1998 | Okumura et al. ..................... 327/534 |
| 5,821,769 | 10/1998 | Douseki ................................ 327/534 |
| 5,838,047 | 11/1998 | Yamauchi et al. .................... 327/537 |
| 5,933,047 * | 8/1999 | Zhu et al. ............................. 327/534 |
| 6,049,230 * | 4/2000 | Durham et al. ...................... 327/534 |

FOREIGN PATENT DOCUMENTS

| | | |
|---|---|---|
| 3066159 | 3/1991 | (JP) . |
| 9162417 | 6/1997 | (JP) . |

OTHER PUBLICATIONS

IBM Technical Disclosure Bulletin, vol. 25, No. 11A, Apr. 1983, pp. 5829–5830, by D. E. DeBar, "Dynamic Substrate Bias to Achieve Radiation Hardening".

* cited by examiner

Primary Examiner—Terry D. Cunningham
(74) Attorney, Agent, or Firm—Joseph C. Redmond, Jr.; Joscelyn G. Cockburn

(57) ABSTRACT

A CMOS device fabricated in a silicon-on-insulator structure and including circuitry and methods in a first embodiment dynamically shifts the threshold voltage of the CMOS device in a receiver to provide improved noise margin and in a second embodiment dynamically matches the threshold voltages in a differential amplifier to correct for manufacturing offset. To dynamically shift the threshold voltage for noise immunity, the back gate or bulk nodes of the devices is shifted through two similar circuits comprised of npn inverters with clamping devices. The back gate of the n device is biased at 0 volts for the maximum Vth and is biased at +1 threshold for the minimum Vth of the device. Only the back gate of the p device is biased at Vdd for the maximum Vth of the device and is biased at 1 Vth below Vdd for the minimum Vth of the device. The Vth of the n device and the p device should be less than the forward bias of the respective source volt junctions to prevent unwanted bipolar currents. By driving the back gates in opposite direction and in phase with the input to the receiver circuit, the threshold voltage of the receiver is moved away from ground (GND) when the input is at a logical "0" and way from Vdd when the input is at a logical "1" which raises the noise immunity of the receiver and speeds the response of the receiver to a desired signal To dynamically match a differential pair for offset correction, a feedback circuit performs a Fast Fourier Transformer analysis of the output signal to determine the presence of even harmonics. A feedback voltage is generated representative of the even harmonics and applied to the back bias contacts of the CMOS devices to correct the effects of the threshold mismatch in the differential pair.

16 Claims, 9 Drawing Sheets

CMOS DEVICE AND CIRCUIT AND METHOD OF OPERATION DYNAMICALLY CONTROLLING THRESHOLD VOLTAGE

BACKGROUND OF THE INVENTION

1. Field of the Invention

This invention relates to semiconductor devices and circuits and methods of operation. More particularly, the invention relates to apparatus and methods for dynamic control and adjustment of threshold voltage in CMOS devices and circuits.

2. Description of Prior Art

The variation in threshold voltage of Field Effect Transistors (FET) leads to undesirable effects and limitations in the operating range of integrated circuits. Many analog circuits depend on the use of differential pairs of transistors and the threshold matching inherent to those circuits. Modern CMOS technology, while well controlled, can exhibit device threshold voltage (Vth) mismatches in the multi-millivolt range and this can be too much for certain types of circuits to achieve aggressive specifications. Analog to digital converters of the flash type, comparators, and certain types of amplifiers are susceptible to threshold mismatches. Altering the threshold voltage (Vth) of FETs by circuit means has been used in the past to compensate for uncertainty in the manufacturing process. Typically, a charge pump or other voltage adjustment means is used to change the bias on the substrate or back gate of the FET to alter the threshold voltage of the FETs. However, compensation was done to all of a particular type in an integrated circuit as a whole, because the substrate of at least one of the device types—P or N—was a common element in the physical structure.

With the advent of Silicon-On-Insulator (SOI) technology, the back gates of both device types—P and N—are now isolated for each individual transistor. Prior art has taught the use of driving isolated back gates to either a high reverse bias of the source-substrate junction to minimize source-drain leakage current in the "off" mode, and to a slightly forward biased region of operation to enhance the source-drain current in the "on" mode. What is needed in the art is an apparatus and method of adjusting the threshold voltage of an individual CMOS transistor in a dynamic mode, so that the transistor can either attain and maintain a characteristic that matches another transistor in the circuit, or such that the characteristics of the circuit can be changed by altering the threshold voltage of an individual transistor.

Prior art related to threshold control includes the following:

U.S. Pat. No. 5,557,234 entitled "Differential Amplifier with Mismatch Correction Using Floating Gates", issued to S. Collins on Sep. 17, 1996 (Collins) discloses a differential amplifier that is adjustable to counteract mismatch without introducing circuit asymmetry. In one embodiment one of the input transistors floating gates is charged to reduce amplifier offset voltage extrapolated to zero input transistor drain current. The amplifier then adjusts to reduce discrepancy between actual design values of input transistor drain voltage by charging one or both of the drain load transistor floating gates. The amplifier may be arranged as an operational amplifier with a second state connected to an input transistor drain. The operational amplifier input offset voltage is determined by the second stage output with a reference and feeding a resulting differences signal to the amplifier input. The input offset voltage is counterbalanced by charging an input transistor floating gate to reduce the difference signal.

U.S. Pat. No. 5,838,047 entitled "CMOS Substrate Biasing for Threshold Voltage Control" to T. Yamauchi et al., issued Nov. 17, 1998 (Yamauchi) discloses a CMOS device in which a potential of Bcc level is applied to the substrate of the P device and a potential Vs. is applied to the substrate of the N device in a standby state. As such, the voltage between the source and substrate of the P and N transistors becomes 0 V. In an active state, potentials render the voltage between the source and substrate lower than the built in potentials are applied to respective substrates of the P and N devices. As such, the threshold voltage of the transistor is lowered in an active state compared to a standby state, and almost no leakage current flows between the source and substrate.

IBM Technical Disclosure Bulletin Vol. 25, No. 11A, April 1983, pp. 5829–30, by D. E. DeBar entitled "Dynamic Substrate Bias to Achieve Radiation Hardening" (DeBar) discloses a substrate bias compensation which monitors the threshold voltage of a sample FET circuit on an integrated circuit chip. The circuit modifies the substrate voltage for the chip to compensate for variations in the monitor threshold voltage due to radiation damage such as might occur in a space satellite exposed to a solar flare. A voltage divider establishes a voltage reference for operational amplifier. The amplifier will force the substrate of a FET to whatever is needed to ensure that the load voltage equals the reference voltage. When gamma rays pass through the FET, the intrinsic threshold voltage of the transistor will lower. The $V_t$ is held fixed by the voltage divider and the transistor will tend to conduct more heavily, which will in turn, tend to lower the reference voltage. The reference voltage is fed back to a non-inverting input of the amplifier. The output of the amplifier will move more negative to a voltage such that the load voltage will equal the reference voltage and the intrinsic threshold voltage equals the threshold for the drain current.

Japanese patent 9-162417 assigned to Northern Telecom, Ltd., issued Jun. 20, 1997 (Northern) discloses a silicon on insulator substrate containing an N and P devices formed in selected areas of the insulation dielectric layer. A pair of back gate electrodes is formed in the silicon substrate under the insulation dielectric layer. The first back gate electrode is extended to the downside of the P device. The second back gate electrode is extended to the downside of the N device. Each back gate electrode is a contact part, through which bias voltage is applied to the devices. The threshold potential of the devices is controlled by regulating the bias voltage applied to the back gate electrodes.

Japanese patent 3-66159 to K. Hiroyuki et al., issued Mar. 20, 1991 (Hiroyuki) discloses a back gate potential impressed by an interlayer connection formed under a P type silicon on insulator layer via resistance element formed so as to be connected to the inner layer. A back gate voltage input terminal is formed at the resistance element. A seed which transforms a polycrystalline layer into a single crystal may be used as the interlayer interconnection layer. A layer in which a CMOS inverter is formed and the resistance element used to adjust a threshold voltage of the CMOS inverter are formed in different layers. Consequently, the CMOS inverter and the resistance element for back gate voltage adjustment use are not formed on the same plane. As a result, the CMOS inverter can be integrated highly.

U.S. Pat. No. 5,814,899 entitled "SOI-Type Semiconductor Device with Variable Threshold Voltages" to K. Okumura et al., issued Sep. 29, 1998 (Okumura) discloses in an SOI type device, a power supply voltage applied to back gates of P-channel devices in a standby mode, and a voltage lower than the power supply voltage is applied to the back gates of the P-channel devices in an active mode. A ground voltage is applied to the back gates of the N-channel devices in the standby mode, and a voltage higher than the ground voltage is applied to the back gates of the N-channel device sin an active mode. Since the transistors are electrically isolated from the substrate, no short circuit is generated between the transistor wells and the substrate. Also, no substantial parasitic capacitance exists between the transistor well and the substrate, a transition time from standby mode to an active mode or vice-a-versa can be reduced.

U.S. Pat. No. 5,646,900 entitled "Sense Amplifier Including MOS Transistors Having Threshold Voltages Controlled Dynamically in a Semiconductor Memory Device" to M. Tsukude et al., issued Jul. 8, 1997 (Tsukude) discloses an N-channel sense amplifier having back gate potential set to a back gate precharge potential higher than a potential intermediate between an operation power supply potential and a ground potential prior to start of sensing. The potential is lowered following the lower of an n common source potential during sensing. The n common source node is precharged to the intermediate potential. The back gate precharge potential set no greater than a potential of the intermediate potential plus a pn junction diffusion to suppress leakage current from the back gate to source or drain of each of the sense amplifier transistors. P channel sense amplifier transistors have also their back gate potential set to a precharge potential lower than the intermediate potential prior to sensing ope4ration and raised following the rise of a p common source node potential.

U.S. Pat. No. 5,103,277 entitled "Radiation Hard CMOS Circuits in Silicon-On-Insulator Films" to A. L. Caviglia et al., issued Apr. 7, 1992 (Caviglia) discloses compensating threshold voltage shifts of FET devices where the threshold voltage shifts are induced by radiation dosage. The FETs are formed in a relatively thin layer of silicon on an insulator supported by a substrate. The compensating means includes a pair of sensor FETs formed integrally with the device. An operational amplifier and a back gate are formed opposite the channel regions of the FETs. The sensor FETs develop an output voltage that is applied as one input to the operational amplifier. A reference voltage, equal to the sensor output voltage prior to exposure to radiation, is applied as a second input to the operational amplifier. The amplifier output is applied to the back gate. The sensor output voltage changes as a result of radiation. The amplifier output then changes, altering the back gate voltage in a manner tending to restore the sensor output to the original value. Such change in the back gate voltage compensates for radiation induced changes in the threshold voltage of the FETs.

None of the prior art disclose apparatus and methods of dynamically adjusting a threshold voltage of an individual transistor in a CMOS device, such that the transistor can either attain or maintain a characteristic that matches another transistor in a device or the characteristic of the device can be changed by altering the threshold voltage (Vth) of an individual transistor.

SUMMARY OF THE INVENTION

An object of the invention is an apparatus and methods for dynamic control and adjustment of transistor threshold mismatch or individual transistor characteristics in CMOS devices.

Another object is an apparatus and method for controlling the back bias nodes of CMOS device to control the threshold voltages of the transistors.

Another object is a CMOS receiver having improved noise immunity.

Another object is a CMOS differential amplifier having on-chip or off-chip means for dynamically correcting offset voltage.

Another object is a CMOS device having back bias electrodes and a feedback circuit for dynamically controlling threshold voltages of the transistors.

These and other objects, features and advantages are achieved in a CMOS device fabricated in a silicon-on-insulator structure and including circuitry and methods in a first embodiment to dynamically shift the threshold voltage of the CMOS device in a receiver to provide improved noise margin and in a second embodiment to dynamically match the threshold voltages in a differential amplifier to correct for manufacturing offset. To dynamically shift the threshold voltage for noise immunity, the CMOS device includes back gate or bulk nodes which are shifted through two similar circuits comprised of CMOS inverters with clamping devices. The back gate of the n device is biased at 0 volts for the maximum Vth and is biased at +1 threshold for the minimum Vth of the device. Only the back gate of the p device is biased at Vdd for the maximum Vth of the device and is biased at 1 Vth below Vdd for the minimum Vth of the device. The Vth of the n device and the p device should be less than the forward bias of the respective source volt junctions to prevent unwanted bipolar currents. A feedback voltage is generated to drive the back gates in opposite direction and in phase with the input to the receiver circuit. The feedback voltage drives the threshold voltage of the receiver away from ground (GND) when the input is at a logical "0" and away from Vdd when the input is at a logical "1" which raises the noise immunity of the receiver. To dynamically match a differential pair for offset correction, a Fast Fourier Transform analysis of output harmonics is conducted to determine any mismatch between input harmonics and output harmonics. Any mismatch is translated into a voltage representative of the offset and supplied to a feedback circuit. The feedback voltage is returned to the differential pair until the even harmonics in the output signal are not present, in which case, the threshold voltages of the differential pair have been matched eliminating the effect of offset.

DESCRIPTION OF THE DRAWING

The invention will be further understood from the following description of a preferred embodiment taken in conjunction with an appended drawing, in which.

DETAILED DESCRIPTION OF PREFERRED EMBODIMENT

Figure 1A:
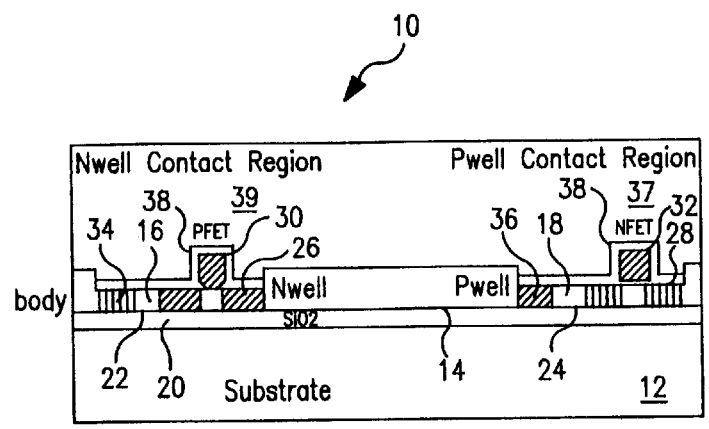
FIGS. 1A, B and C are side and top views of a CMOS device in a silicon-on-insulator structure incorporating back bias contacts for use in the present invention.

FIG. 1A shows a side view of a CMOS device 10 in silicon-on-insulator technology incorporated in the present invention. The process details of fabricating a silicon-on-insulator device are known in the art and described, for example in U.S. Pat. No. 4,467,518 issued Aug. 28, 1984 assigned to the assigned to the same assignee as that of the present invention and incorporated herein by reference. The device 10 comprises a silicon substrate 12 within which is formed a buried layer of silicon dioxide 14. An n layer 16 and p layer 18 are formed in juxtaposed relation on top of the silicon dioxide layer 14. A thick silicon dioxide layer 20 is formed in the n layer and p layer to establish an n well 22 and a p well 24 separated and surrounded by the thick silicon oxide layer 20. After a region of thin gate oxide is grown over the remaining p well and n well regions, polysilicon gates 30 and 32 are formed over the p well and n well regions. The polysilicon gates and the thick oxide regions are used along with blocking photo resist patterns to define the P+ regions and N+ regions, respectively, in the CMOS device 10. P+ implants 26 are formed in the n well. N+ implants 28 are formed in the p well. An n well back bias contact 34 is formed in the p device and a p well back bias contact 36 is formed in the n device. A layer of oxidation 38 is formed on top of the n and p wells and polysilicon gates to complete an nfet transistor 37 and a pfet transistor 39 the CMOS device. The back bias contacts 34 and 36 are used in dynamically correcting for V threshold offset between the CMOS devices or changing the threshold voltage of a transistor, as will be described hereinafter.

Figure 1B:
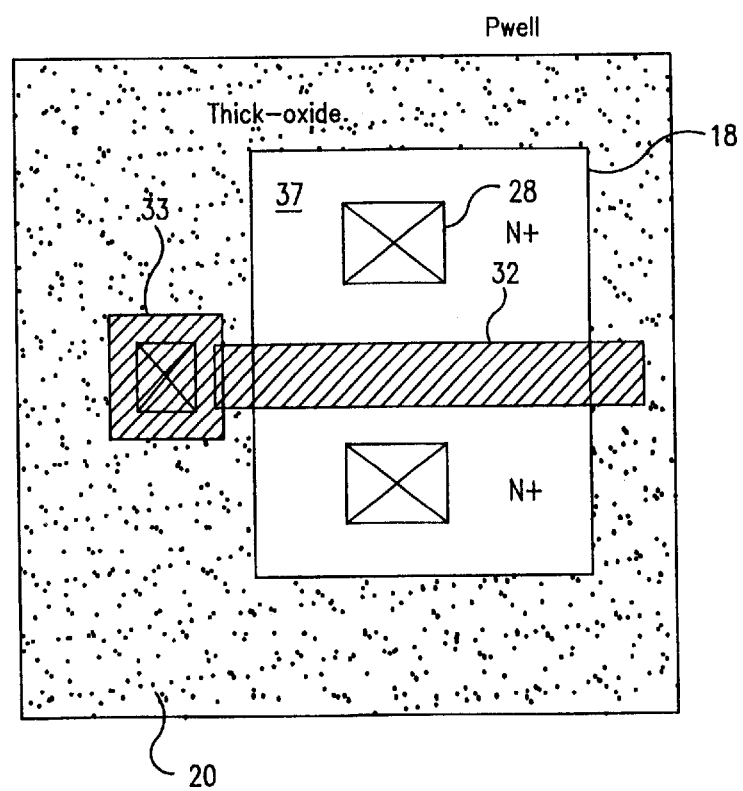
Figure 1C:
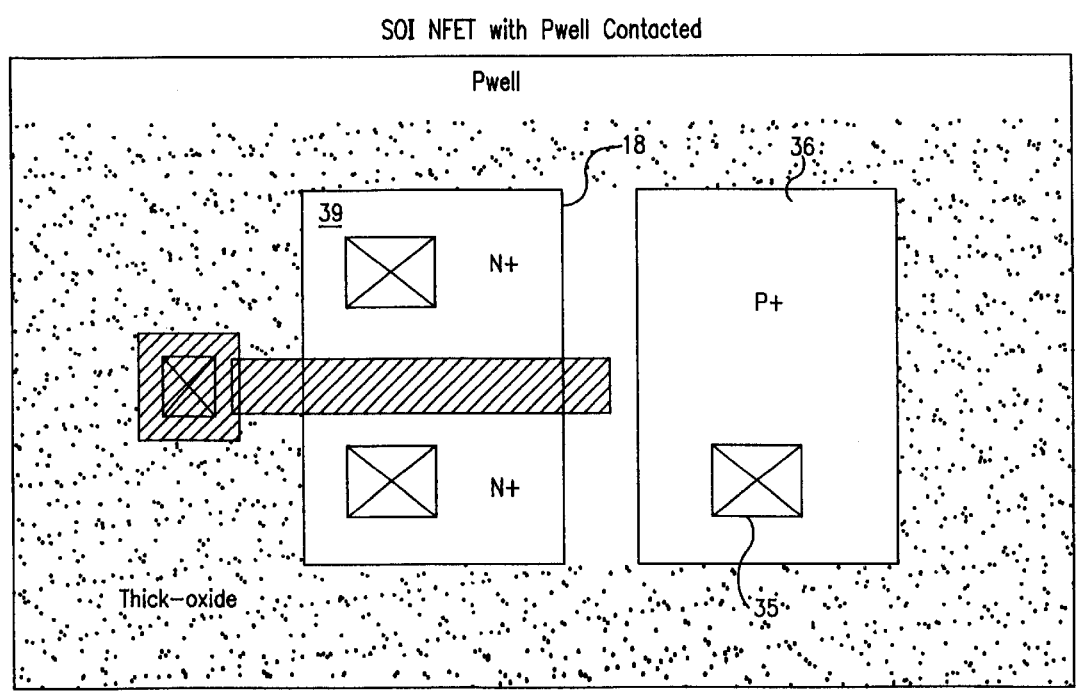

FIG. 1B is a top view of the device 10 in silicon-on-insulator including an n type device 37 with the n+ electrodes 28 in the p well 18 without the p well contacted. The gate electrode 32 is disposed between and above the electrodes 28. In FIG. 1C, a P+ back biased electrode 36 is added to the device in FIG. 1B and is disposed in the p well 18, spaced from the N+ implants 28. A contact 35 is made to the back biased electrode 36. The operation of the device with the back bias contacts 36 will be described in conjunction with a digital receiver 40 shown in FIG. 2 and a differential amplifier 100 shown in FIG. 5, both to be described hereinafter.

Figure 2:
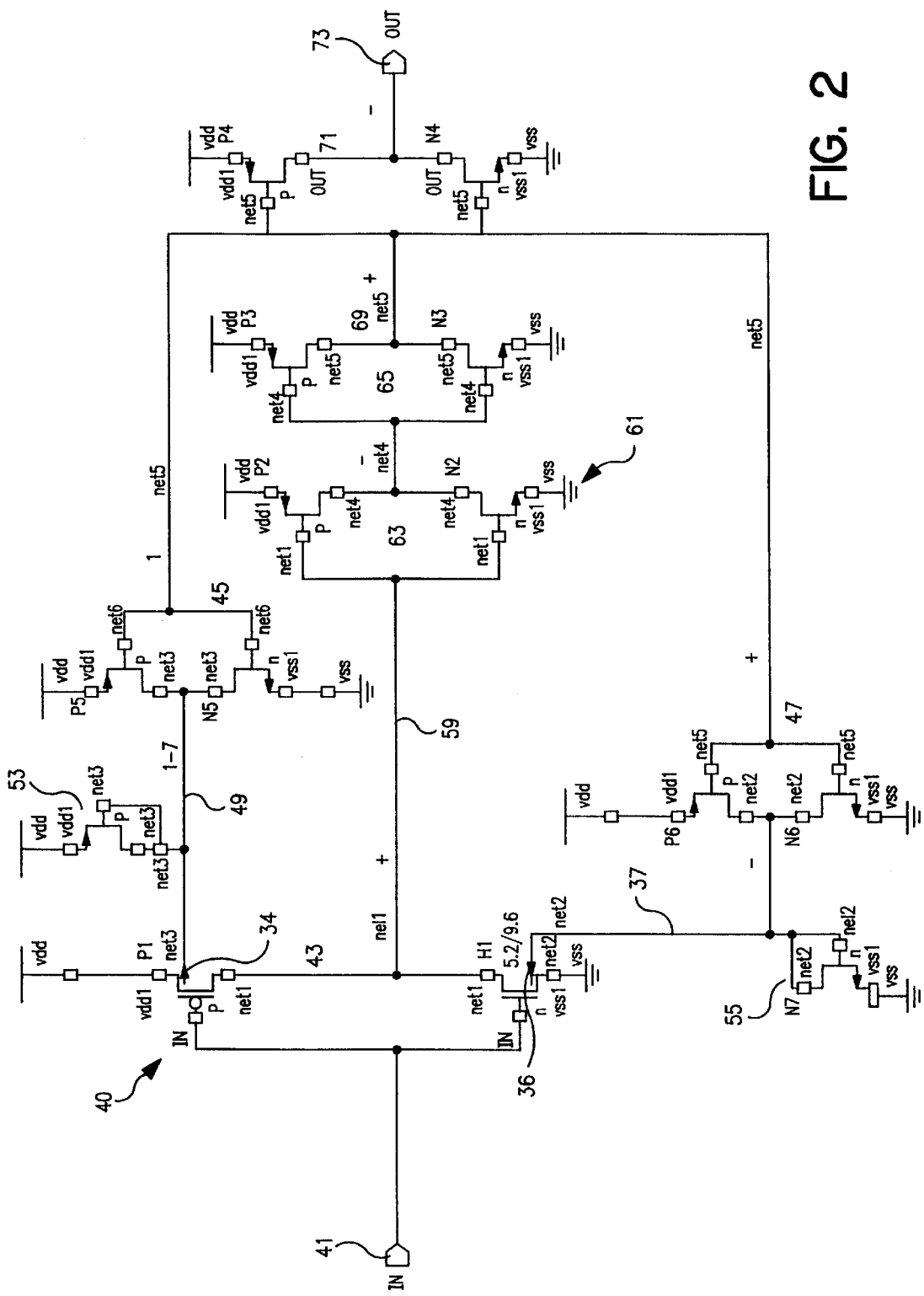
FIG. 2 is a circuit diagram of a receiver incorporating the CMOS devices of FIGS. 1A and 1B and having improved noise immunity with respect to input signals.

In FIG. 2, the receiver 40 includes an input node 41 coupled to the gates of a CMOS inverter 43 including transistors n1 and p1 with drain electrodes connected together, to form Net 1, and source electrodes connected to GND and VDD, respectively. The back bias contacts 34 and 36 are connected to a feedback circuit Net 5. The feedback circuit includes feedback inverters 45, 47 coupled to the back bias contacts 34, 36. The feedback circuit includes clamping devices 53, 55. An output 59 is provided from the device 43 to a two-stage CMOS buffer 61 including a first stage 63 and a second stage 65, each stage having their drain electrodes connected together and providing an output to the next stage. The source electrodes are conmected between VDD and GND. An output 69 is provided from the second stage 65 to Net 5 and to gate electrodes of a CMOS output buffer 71. An output 73 is taken from the common drain electrodes of the buffer 71.

When the input voltage level at the terminal 41 is low or zero (0), the inverter 43 provides an output 59 which is high (1) or VDD. The output 59 causes the buffer 61 to provide an output 69 which is high (1) or VDD. The output 69 causes the output buffer 71 to provide a low (0) output, or GND at the terminal 73.

The high feedback voltage at the terminal 69, when returned to the inverting buffers 45, 47, causes a low back bias voltage or GND to be supplied to the back bias contact 36 and a bias voltage approaching one Vth below VDD to be supplied to the back bias contact 34 in the inverter 43. The switch point for the inverter 43 is moved further from GND by offsetting the threshold voltage (Vth) for n1 to a greater value and the threshold voltage of p1 to a lesser (absolute) value. Specifically in the inverter 43, when the feedback voltage of Net 5 is positive for a low input signal, the back bias contact of the n1 device is driven negatively to GND which increases the threshold voltage of n1.

When the input terminal 41 is high or 1, the output 59 is low or GND. The output at terminal 69 is low and the output at terminal 73 is high. The Net 5 feedback voltage turns on p5 in the inverter 45 and p6 in the inverter 47 which provides a more positive voltage to the back contacts 34 and 36. As a result, the back gate of N1 is forward biased at one Vth above GND for the minimum Vth threshold N1 and the back gate of P1 is biased at VDD for the maximum threshold of P1.

Thus, by driving the back gates 34 and 36 in the same relative direction and in phase with the input to the receiver circuit, the threshold voltage of the receiver is moved away from GND when the input is at a logical "0" and away from VDD when the input is at a logical "1".

Figure 3:
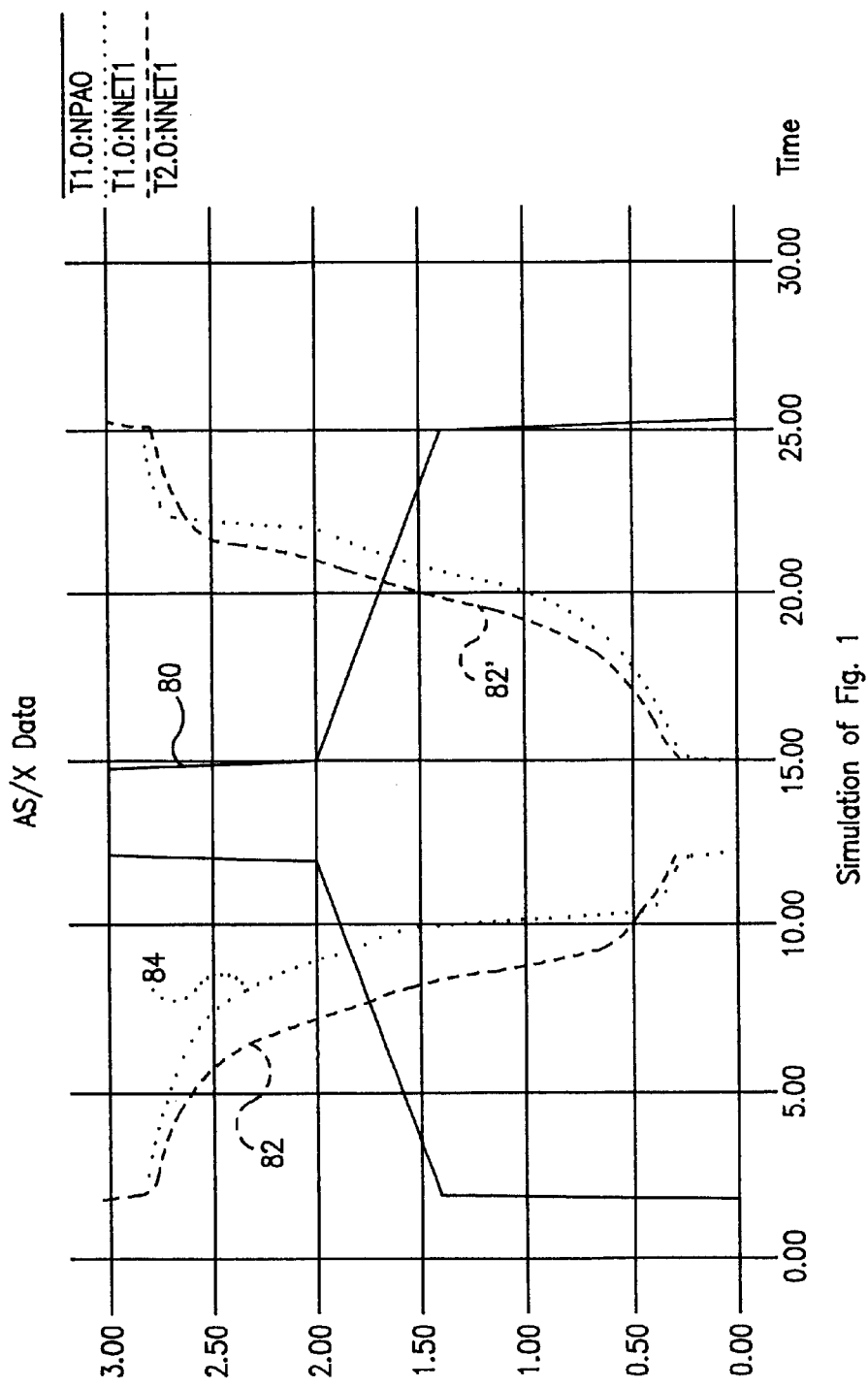
FIG. 3 is a plot of volts versus time showing the operation of FIG. 2 with and without noise immunity for an input pulse.

In FIG. 3, a simulation of the circuit of FIG. 2 is shown in a graph of input/output voltages versus time in seconds. An input pulse 80 is raised to 1.45 Volts and then slowly raised to 2 Volts after which the pulse jumps to 3 Volts and returns along the same or similar path to 0 Volts after 25 seconds. A dashed line 82 shows the transition of the receiver at Net 1 with constant bias applied to the back bias contacts 34 and 36. For a low input signal, Net 1 is at 3 Volts and as the input signal rises through the receiver switch point, the Net 1 voltage level falls along the trace 82 until the output is at 0 Volts. As the input voltage is again lowered, the voltage level at Net 1 increases along the path 82'.

A dotted line 84 shows the operation of the receiver using the variable bias voltage to drive the back biasing contacts 34 and 36 in the same relative direction and in phase with the input whereby the receiver switch point is moved away from GND when the input is at a logical "0" and away from VDD when the input is a logical "1". FIG. 3 shows that when the input voltage is transitioning from low to high, the switch point for the inverter 43, is raised from about 1.75 Volts to about 1.85 Volts, vs the original circuit condition. After the input has transitioned to a high voltage, the P1 and N1 threshold voltages are made to move in opposite directions (lower for N1 and higher for P1), so that the receiver threshold is now moved away from VDD as noted by the rising transition of Net 1 along trace 84 occurring at a lower input voltage level, i.e. 1.65 Volts vs 1.75 Volts, thus contributing to noise immunity while rapidly turning on the receiver when an input pulse is received greater than the threshold.

The voltage levels of the back gates can be changed to provide additional margins of noise immunity if so desired. The additional voltage can be achieved by raising the level of the p clamp devices 53 and n clamp device 55. The threshold voltages of N7 and P7 should be less than the forward bias voltages of the respective source bulk junctions to prevent unwanted bipolar currents.

Figure 4:
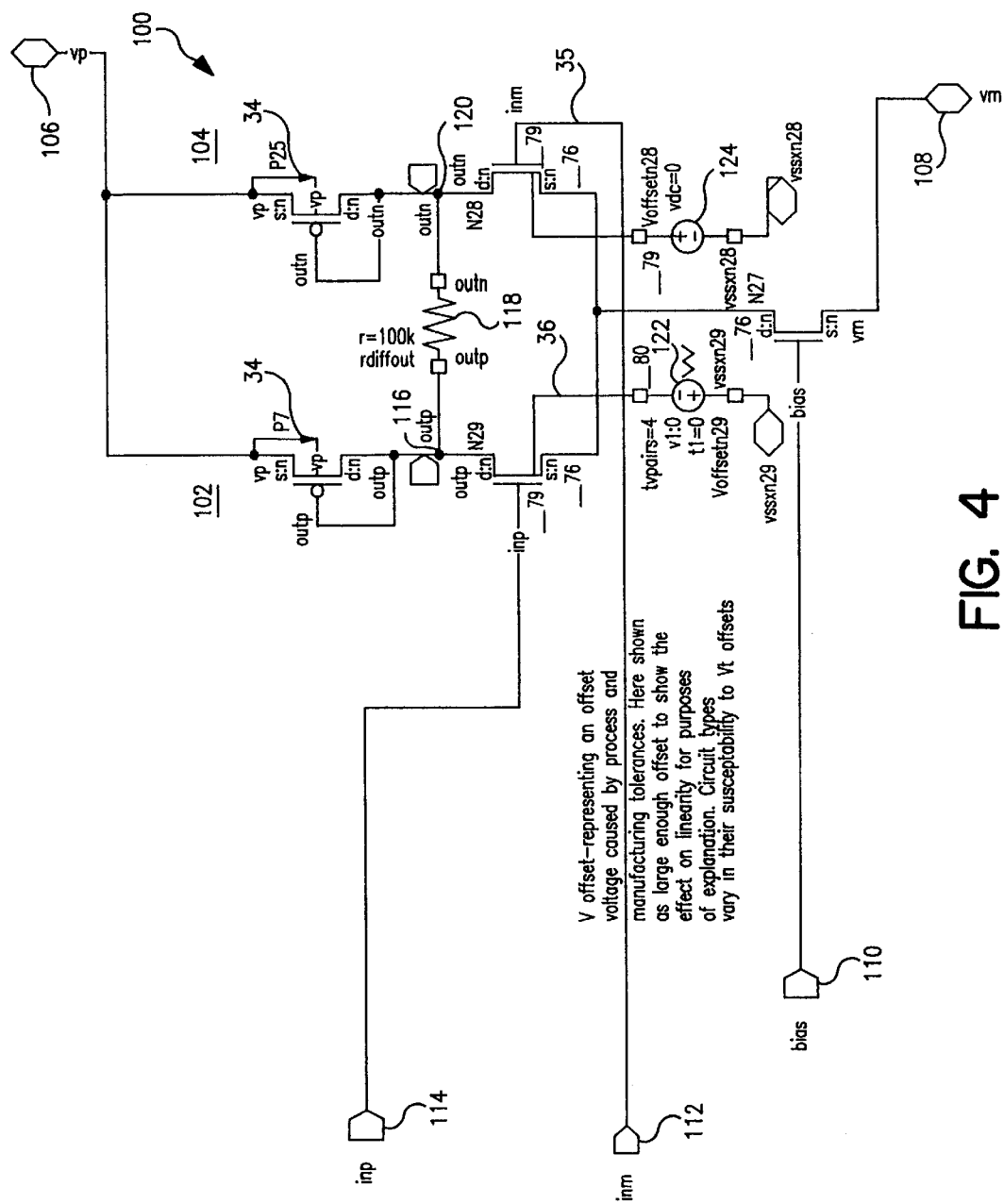
FIG. 4 is a differential amplifier incorporating CMOS devices shown in FIGS. 1A and IC having simulated offset.

Turning to FIG. 4, a differential amplifier 100 incorporating CMOS transistors 102 and 104 (shown in FIGS. 1A and C) have p type devices 7, 25 coupled to n type devices 29, 28 through their common drain electrodes. An output circuit 118 is coupled to the common drain electrodes 116, 120. The p type devices 7 and 25 have their source electrodes coupled to a voltage supply Vdd and their gate and drain connected together to serve as load devices for the n type devices 29, 28, respectively. The n type devices 29, 28 have their source electrodes coupled to a reference potential 108 through an n type bias transistor 27 having its gate electrode connected to a bias voltage 110. The n type devices 29, 28 gate electrodes are connected to an input positive signal 114 and an input minus signal 112, respectively. The back bias contacts 34 and 36 are coupled to simulated offset voltage 122, 124, representative of an offset voltage incurred in the devices n28 and n29 from manufacturing processes.

Figure 5:
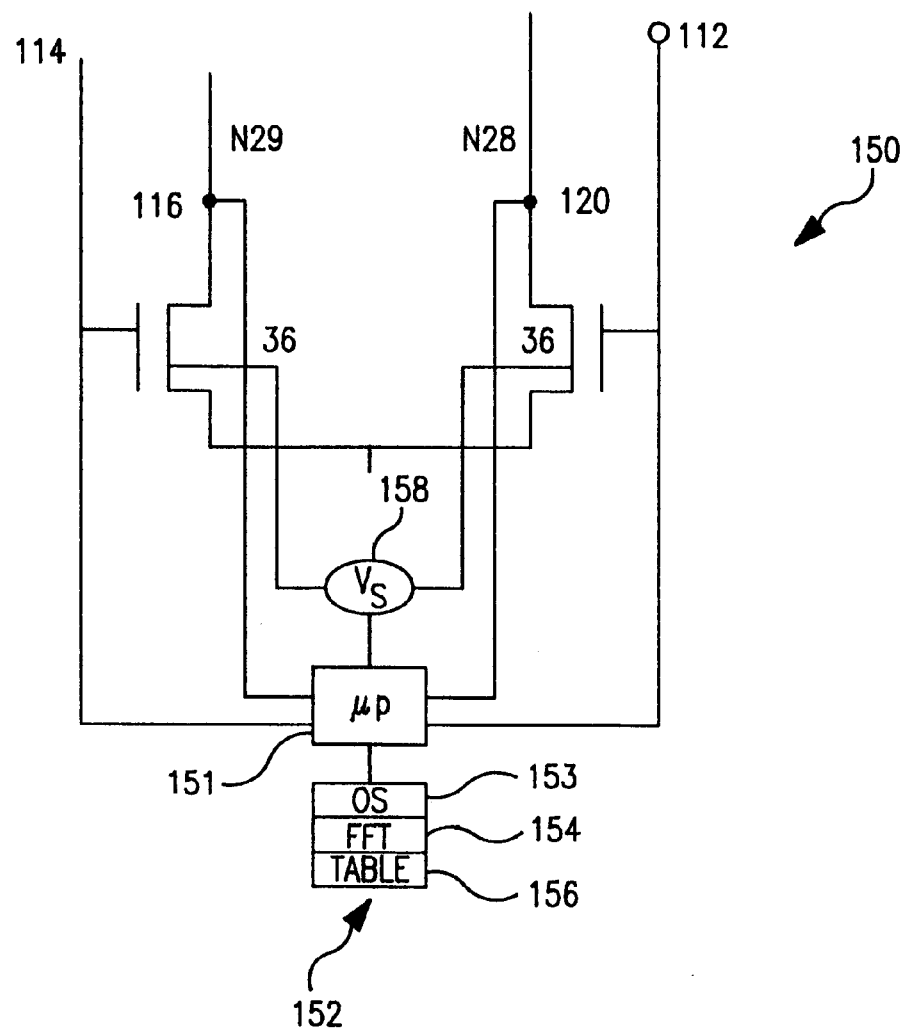
FIG. 5 is a representation of a feedback circuit included in the differential amplifier of FIG. 4.

FIG. 5 shows one example of a voltage feedback circuit 150 which automatically generates a voltage for correction of the threshold mismatch between n type device 28 and 29 as a result of manufacture. The circuit 150 includes a microprocessor 151 coupled to the input terminals 114 and 112 and to the output terminals 116 and 120 (See FIG. 4). The processor 151 includes a memory 152 which stores an operating system 153, a Fast Fourier Transform application 154, and an offset table 156. The Fast Fourier Transforms (FFT) application is executed for detection of harmonic differences between the signals at the input and output terminals and introduced by threshold offset which is a well-known technique. Based on the harmonic differences identified by the FFT in the input-output signals and indicative of the offset between the n type devices 29, 28, the table 156 can be constructed to indicate a voltage level to correct the offset. The processor scans the table and provides an output signal level to control a voltage supply 158 coupled to the n type devices 29, 28 back bias contacts 36. In response to the signal level, the voltage supply adjusts the potential of the back bias contacts to correct for the offset representative of the threshold mismatch between the n type devices 29, 28 introduced during manufacture of the devices.

Figure 6:
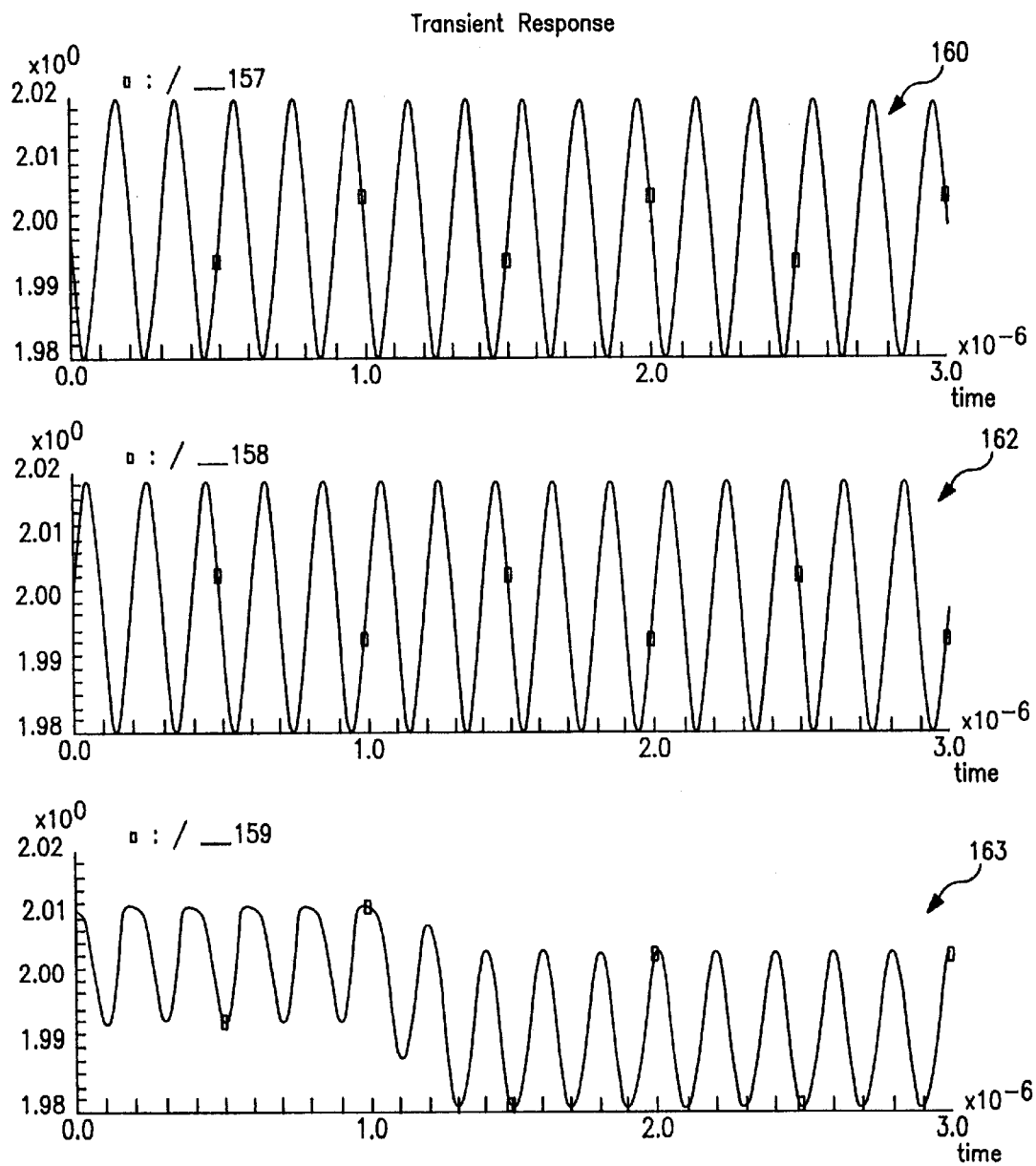
FIG. 6 is a transistor response of the input and output signals of FIG. 5 showing the effects of Vth mismatch or offset in terms of signal amplitude versus time.

FIG. 6 shows input signals 160 and 162 provided to the input terminals 112 and 114 and the output signal at the terminals 116, 120 serving the n type devices 29, 28 (See FIG. 4) before and after offset correction. The offset interval shown in the time period from "0" to "1.3" microseconds causes the output signals to appear flattened or clipped at the top instead of sine wave shaped as in the case of the input signals 160, 162 during this period. The flattening is a manifestation of the presence of even harmonics in the output signal. With offset correction occurring in the time period from 1.3 to 3.0 microseconds, the shape of the output signal 163 is returned to the shape of the input signals 160, 162 indicating offsets have been corrected.

Figure 7:
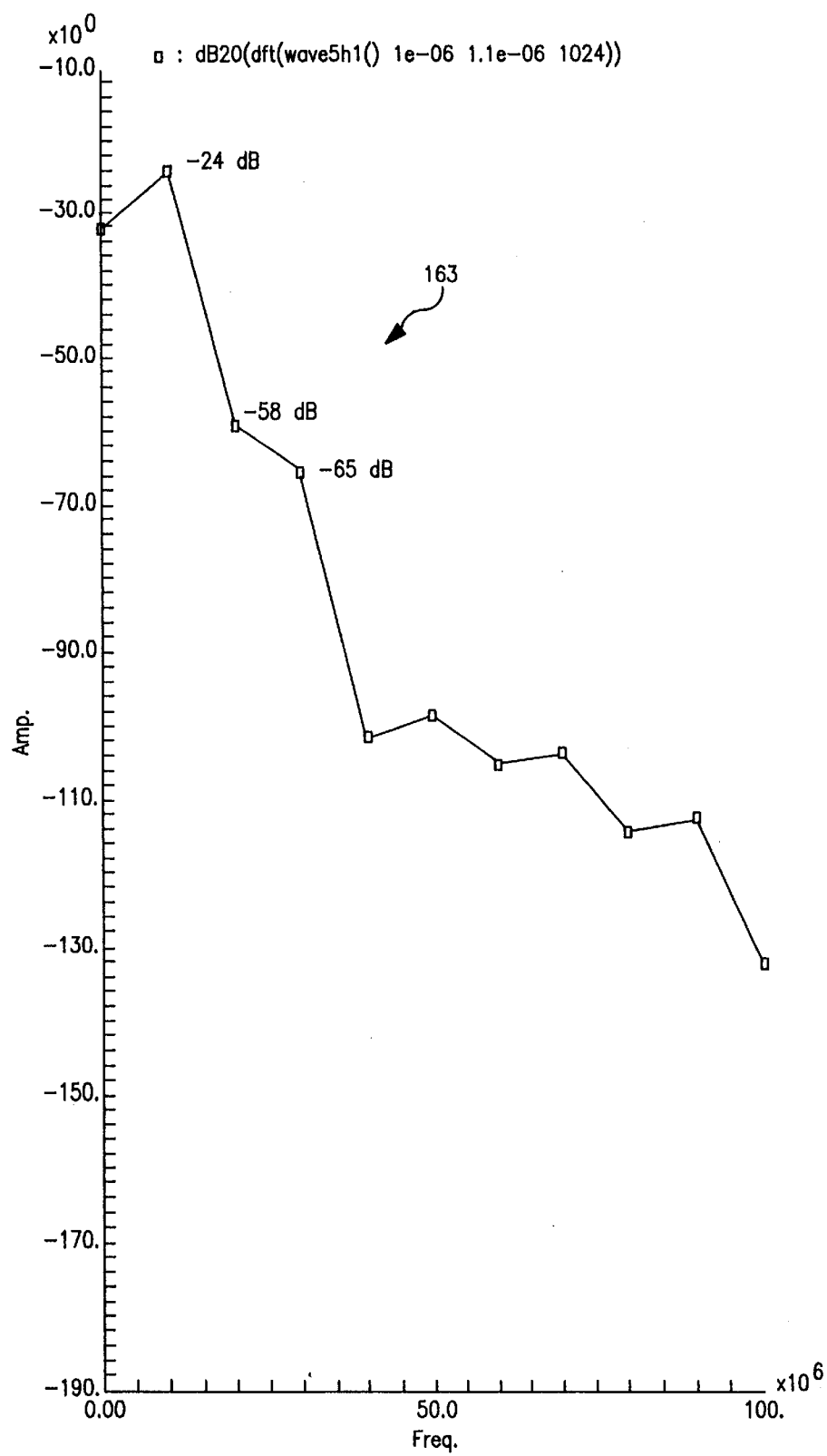
FIG. 7 is a circuit diagram for dynamically generating an offset voltage in accordance with the principles of the present invention for application to the differential amplifier of FIG. 5 to correct for Vth mismatch or offset between the CMOS devices.

FIG. 7 shows in more detail the various harmonics occurring in the output signal 163 before offset correction. At 0 frequency the output signal includes a DC component of approximately −32 dB. The fundamental harmonic has amplitude of −24 dB and occurs at 10 mHertz. The second harmonic has amplitude of −58 dB and occurs at 20 mHertz. The third harmonic has amplitude of −65 dB and occurs at 30 mHertz. The fourth through 10th harmonics are shown in the remainder of the graph. The even harmonics indicates distortion has been introduced by the threshold mismatch between n type devices 29, 28.

Figure 8:
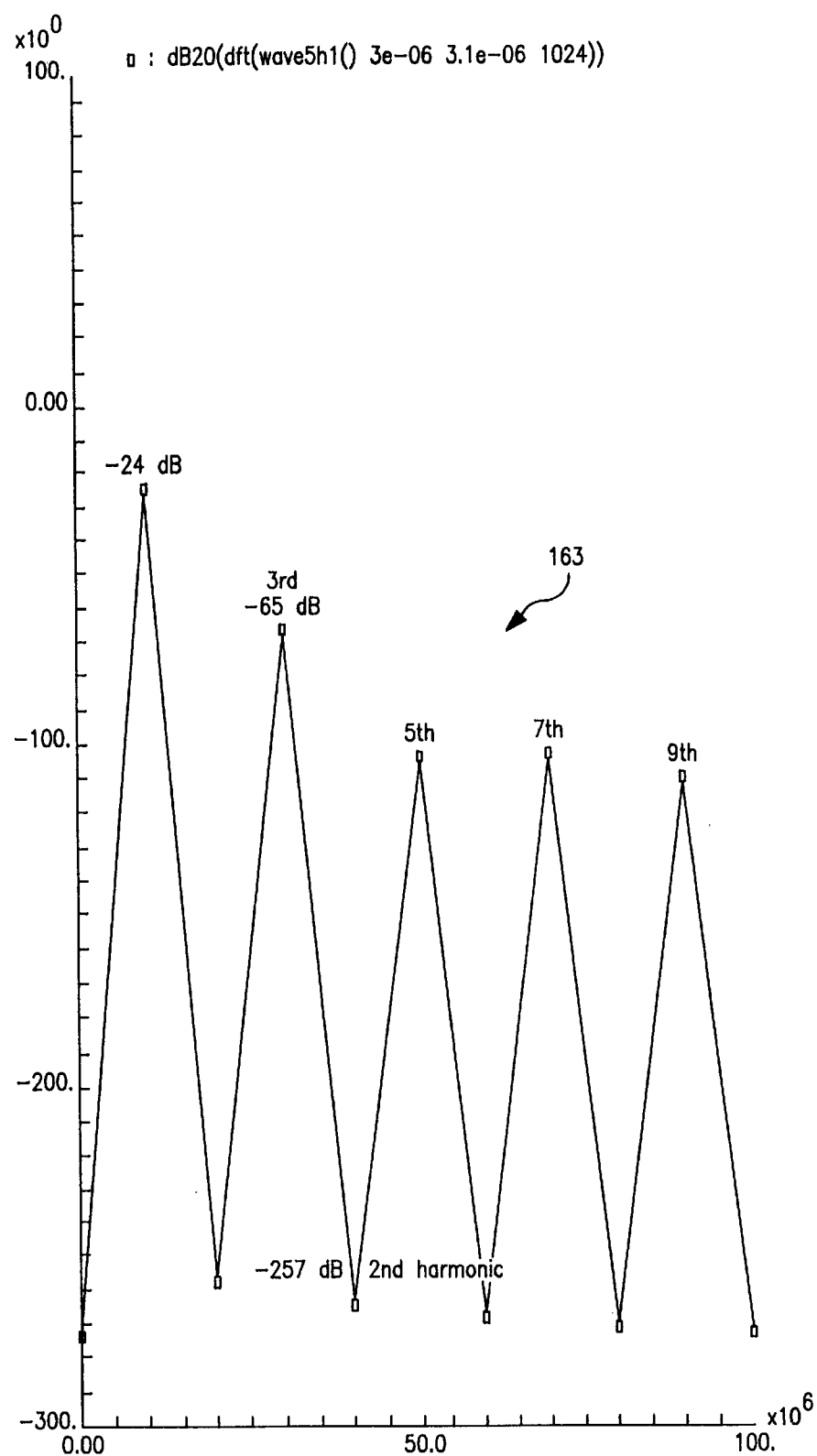
FIG. 8 is a representation of the offset in FIG. 7 in terms of amplitude and frequency for the various harmonics in the output signal prior to correction of the offset voltage.

FIG. 8 shows the change in the various harmonics in the output signal 163 after the offset voltage supplied by the feedback circuit 150 is provided to the transistors connected to the output terminals 116, 120 (See FIG. 5). Specifically, the DC component in the output has been essentially removed while the first and third harmonics are essentially at the same amplitude as in FIG. 7. The even harmonics have essentially dropped out of the output signal. Without the presence of the even harmonics due to the offset voltage provided by the feedback circuit 150, the output signal 163 is the same as the input signals 160, 162 as shown in FIG. 6.

Summarizing, CMOS devices including back bias contacts have been shown to control noise immunity in a receiver and correct for threshold offset in differential amplifiers. The back bias contacts in the receiver, responsive to a feedback voltage, are driven in opposite directions and in phase with an input to the receiver. The feedback voltage raises the threshold voltages when the input signals goes from a low level to a higher level and pushes the threshold level negative when the input level goes from a high level to a low level which raises the noise immunity of the receiver and speeds the response of the receiver to a desired signal. In a differential amplifier, a feedback voltage adjusts the potential of the back bias contacts to eliminate distortion caused by threshold mismatch. The amplifier output signal is analyzed using a Fast Fourier Transform to detect the presence of even harmonics as an indication of threshold mismatch. A microprocessor using a table lookup based on the FFT analysis converts the threshold mismatch as represented by the even harmonics into a signal representative of the threshold mismatch. A voltage source responsive to the signal adjusts the potential of the back bias contacts to correct the CMOS transistors for the threshold mismatch.

While the invention has been shown and described in conjunction with a preferred embodiment, with various changes that can be made without departing from the spirit and scope of the invention, as defined in the appended claims, in which:

We claim:

1. Apparatus having dynamically controlled threshold voltage (Vth), comprising:
   a CMOS device including p and n type transistors having back bias gate contacts for receiving an input signal;
   an input node coupled to the CMOS amplifier device;
   an output circuit coupled to the CMOS device and providing an output signal related to the input sinal;
   a feedback circuit coupled to the CMOS device output and the output circuit; and
   means included in the feedback circuit coupled to the back bias contacts dynamically controlling the threshold voltages of the p and n type transistors for improved amplifier performance.

2. The apparatus of claim 1 wherein the CMOS amplifier is a digital receiver comprising:
   means for dynamically shifting the threshold voltages of the CMOS device thereby improving the receiver immunity to noise in the input signal.

3. The apparatus of claim 1 wherein the CMOS amplifier is a differential amplifier comprising:
   means for dynamically matching the p and n type transistor thresholds.

4. The apparatus of claim 2 wherein the digital receiver further comprises:
   clamping devices coupled to the feedback circuit for varying the immunity of the receiver to noise in the input signal.

5. The apparatus of claim 2 further comprising:

means in the feedback circuit moreover a reference potential to drive the back bias contacts in phase with the input signal whereby threshold voltages of the p and n type transistors are moved away from the the reference potential when the input signal is at logical "0" and away from a supply voltage when the input is at a logical "1".

6. The apparatus of claim 3 wherein the feedback circuit further comprises:

means including a Fast Fourier Transform application for measuring harmonic differences at the input and output terminals as an indication of threshold mismatch in the p and n type transistors.

7. The apparatus of claim 6 further comprising:

means coupling a processor to the input and output terminals and determining an offset voltage indicative of the threshold mismatch.

8. The apparatus of claim 6 further comprising:

means coupling the processor to the back bias contacts for providing a voltage to the back bias contacts to correct the offset voltage and threshold mismatch of the p and n type transistors.

9. The apparatus of claim 3 further comprising:

means in the feedback circuit for analyzing an input signal and an output signal frequency composition; and means included in the feedback circuit for determining from the frequency analysis a voltage for application to the back bias contacts to eliminate signal distortion in an output signal due to threshold mismatch.

10. In a CMOS amplifier including p and n type transistors having back bias contacts, a method for dynamically controlling threshold voltage (Vth) in the p and n type transistors, comprising the steps of:

connecting an input node to the CMOS amplifier;

connecting an output circuit to the CMOS amplifier;

coupling a feedback circuit from the output circuit to the backbias contacts; and generating a feedback voltage in the feedback circuit for dynamically controlling the threshold voltages of the p and n type transistors.

11. The method of claim 10 further comprising the steps of:

providing the feedback voltage to the back bias contacts to correct offset voltage in the p and n type transistors.

12. The method of claim 11 further comprising the steps of:

driving the back bias contacts in phase with an input signal whereby the threshold voltage of the input circuit is moved away from a reference potential when the input signal is at logical "0" and away from a supply voltage when the input is at a logical "1".

13. The method of claim 10 further comprising the steps of:

analyzing an output signal frequency composition to determine the presence of even harmonics as an indication of threshold mismatch;

generating an offset voltage to adjust the threshold voltages of the p and n type transistors to correct for threshold mismatch; and applying the offset voltage to the back bias contacts to eliminate the threshold mismatch.

14. Apparatus for dynamically controlling threshold voltage (Vth) in a CMOS amplifier, comprising:

a CMOS device including p and n type transistors having back bias gate contacts for receiving an input signal; an output circuit coupled to the CMOS device and providing an output signal related to the input signal;

a feedback circuit coupled to the CMOS device and the output circuit and providing means to drive the back bias contacts in phase with the input signal whereby threshold voltages of the p and n type transistors are moved away from a reference potential when the input signal is at logical "0" and away from a supply voltage when the input is at a logical "1".

15. In a CMOS amplifier including p and n type transistors having back bias contacts, a method for dynamically controlling threshold voltage (Vth) in the p and n type transistors, comprising the steps of:

connecting an input node to the CMOS amplifier;

connecting an output circuit to the CMOS amplifier;

coupling a feedback circuit from the output circuit to the backbias contacts;

providing the feedback voltage to the back bias contacts to correct offset voltage in the p and n type transistors;

generating a feedback voltage in the feedback circuit including reference potential for dynamically controlling the threshold voltages of the p and n type transistors; and driving the back bias contacts in phase with an input signal whereby the threshold voltage of the input circuit is moved away from a reference potential when the input signal is at logical "0" and away from a supply voltage when the input is at a logical "1".

16. The method of claim 15 further comprising the steps of:

analyzing an output signal frequency composition to determine the presence of even harmonics as an indication of threshold mismatch;

generating an offset voltage to adjust the threshold voltages of the p and n type transistors to correct for threshold mismatch; and applying the offset voltage to the backbias contact to eliminate the threshold mismatch between the p and n type transistors.

* * * * *